US012683126B2

(12) United States Patent　　　　　　(10) Patent No.:　US 12,683,126 B2
Wood et al.　　　　　　　　　　　　　　(45) Date of Patent:　　Jul. 14, 2026

(54) METHOD OF PLASMA ETCHING

(71) Applicant: SPTS Technologies Limited, Newport (GB)

(72) Inventors: Alex Huw Wood, Newport (GB); Kevin Riddell, Newport (GB); Huma Ashraf, Newport (GB); Janet Hopkins, Newport (GB)

(73) Assignee: SPTS Technologies Limited, Newport (GB)

( * ) Notice: Subject to any disclaimer, the term of this patent is extended or adjusted under 35 U.S.C. 154(b) by 788 days.

(21) Appl. No.: 17/983,341

(22) Filed: Nov. 8, 2022

(65) Prior Publication Data

US 2023/0170188 A1　　Jun. 1, 2023

(30) Foreign Application Priority Data

Nov. 29, 2021　(GB) ..................................... 2117193

(51) Int. Cl.
　*H01J 37/32*　　　　(2006.01)
(52) U.S. Cl.
　CPC .. *H01J 37/32449* (2013.01); *H01J 37/32816* (2013.01); *H01J 37/321* (2013.01); *H01J 2237/182* (2013.01); *H01J 2237/3343* (2013.01)
(58) Field of Classification Search
　CPC .......... H01L 21/3065; H01L 21/31055; H01L 21/30604; H10P 50/267; H10P 50/285
　See application file for complete search history.

(56) References Cited

U.S. PATENT DOCUMENTS

2004/0195216 A1* 10/2004 Strang ............... H01J 37/32082
　　　　　　　　　　　　　　　　　219/121.43
2010/0193781 A1* 8/2010 Tripathy ............. B81C 1/00484
　　　　　　　　　　　　　　　　　438/479

(Continued)

FOREIGN PATENT DOCUMENTS

JP　　2003209260 A　　7/2003
JP　　2008010611 A　　1/2008
JP　　2009055128 A　　3/2009

OTHER PUBLICATIONS

Shao et al., High Figure-of-Merit Lamb Wave Resonators Based on AL0.7Sc0.3N Thin Film, Electron Dev. Letters, Sep. 2021, 42(9), 1378-1381.

(Continued)

*Primary Examiner* — Thomas T Pham
(74) *Attorney, Agent, or Firm* — Hodgson Russ LLP

(57)　　　　　　ABSTRACT

An additive-containing aluminium nitride film is plasma etched. The additive-containing aluminium nitride film contains an additive element selected from scandium, yttrium or erbium. A workpiece is placed upon a platen within a plasma chamber. The workpiece includes a substrate having an additive-containing aluminium nitride film deposited thereon and a mask disposed upon the additive-containing aluminium nitride film, which defines at least one trench. A first etching gas is introduced into the chamber with a first flow rate, a second etching gas is introduced into the chamber with a second flow rate, and a plasma is established within the chamber to etch the additive-containing aluminium nitride film exposed within the trench. The first etching gas comprises boron trichloride and the second etching gas comprises chlorine. A ratio of the first flow rate to the second flow rate is greater than or equal to 1:1.

17 Claims, 8 Drawing Sheets

(56)      References Cited

U.S. PATENT DOCUMENTS

2012/0003827 A1* 1/2012 Xu .................... H01L 21/32136
                                                                438/591
2013/0119018 A1* 5/2013 Kanarik ........... H01J 37/32449
                                                                216/67
2018/0130883 A1* 5/2018 Hardy ................ H01L 21/3081
2020/0069890 A1   3/2020 Vigevani et al.

OTHER PUBLICATIONS

Ozzi et al., Al0.83Sc0.17N Contour-Mode Resonators with Electromechanical Coupling in Excess of 4.5%, IEEE Trans. on Ultrasonics, Ferroelectrics, and Frequency, Jan. 2019, 66(1), 146-153.
IPO, Search Report for GB2117193.9, Apr. 28, 2022.
SPTS Technologies, "AlN/AlScn Etch for BAW Devices," SPTS Technologies Ltd., BAW-Etch-Q1/21, Feb. 1, 2021.
Luo et al., "Optimization of ALN and ALSCN Film ICP Etching," IEEE 34th International Conference on Micro Electro Mechanical Systems (MEMS), IEEE, Jan. 25, 2021, pp. 638-641.
Petrich et al., "Investigation of ScAIN for piezoelectric and ferroelectric application," 2019 22nd European Microelectronics and Packaging Conference and Exhibition (EMPC), IMAPS-Europe, Sep. 16, 2019.
EPO, Extended European Search Report for EP Application No. 22197203.7, May 8, 2023.
Japanese Patent Office, Office Action issued in Japanese Application No. 2022-171258, dated Jan. 26, 2026.

* cited by examiner (a)                    (b)

11b

11a (a)                              (b)

METHOD OF PLASMA ETCHING

CROSS-REFERENCE TO RELATED APPLICATIONS

This application claims priority to UK Patent Application No. 2117193.9 filed Nov. 29, 2021, the disclosure of which is hereby incorporated by reference.

FIELD OF THE DISCLOSURE

The present invention relates to a plasma etching process and particularly to a method of plasma etching an additive-containing aluminium nitride film where the additive element comprises an element selected from scandium (Sc), yttrium (Y) or erbium (Er).

BACKGROUND OF THE DISCLOSURE

Aluminium nitride (AlN) and aluminium scandium nitride (AlScN) piezoelectric devices are widely used in bulk acoustic wave (BAW) devices and in piezoelectric micromachined ultrasonic transducers (PMUTs), for example. Mobile phones typically incorporate a number of AlN and AlScN BAW devices and the generation of higher operating frequencies require the use of thinner BAW devices. Improving the piezoelectric performance for thinner devices is a major challenge as tolerances become tighter and the integration of these devices on circuit boards becomes more complicated. The addition of Sc is known to improve the piezoelectric properties of BAW devices, however, the incorporation of Sc in the AlN lattice can lead to an in increased defectivity in the deposited piezoelectric film and the involatile nature of Sc can generate residues which need to be removed during the plasma etch process.

As the percentage of Sc in doped AlN increases, the etch rate typically decreases when using standard chlorine $(Cl_2)$/ argon (Ar) based chemistries. This decrease results in a lower AlScN selectivity to masks (such as photoresist or $SiO_2$ masks), which reduces the critical dimension (CD) and consequently results in a shallower sidewall angle within the AlScN trenches. Common methods of controlling the sidewall profile include adjusting the slope of the pre-etch mask, changing the platen bias, etchant gas flow or process pressure. These methods are commonly effective for lower Sc content AlScN, but at higher Sc percentages the etch becomes increasingly physical, decreasing the overall effectiveness of these methods. Similar effects are observed with AlYN and AlErN films.

The decrease in AlScN etch rate also reduces the selectivity to metal underlayers, leading to increased underlayer loss which can impair the performance of some devices, such as BAW filters. The lower electrical contact to BAW devices is typically molybdenum (Mo), tungsten (W) or platinum (Pt) and if excessive amounts of metal are removed, owing to the reduced etch rate of AlScN, the electrical resistance of the contact will increase, resulting in a degradation of device performance. Typical changes to increase the AlScN etch rate, such as increased platen bias or increased $Cl_2$ flow, may ultimately have little-to-no impact on the sidewall angle or underlayer selectivity, or in some cases may even exacerbate the issue.

The present invention seeks to address at least some of the above-mentioned problems.

BRIEF SUMMARY OF THE DISCLOSURE

According to an aspect of the present invention there is provided a method of plasma etching an additive-containing aluminium nitride film, the additive-containing aluminium nitride film containing an additive element selected from scandium (Sc), yttrium (Y) or erbium (Er), the process comprising:

placing a workpiece upon a platen within a plasma chamber, the workpiece comprising a substrate having an additive-containing aluminium nitride film deposited thereon and a mask disposed upon the additive-containing aluminium nitride film which defines at least one trench;

introducing a first etching gas into the chamber with a first flow rate;

introducing a second etching gas into the chamber with a second flow rate; and establishing a plasma within the chamber to etch the additive-containing aluminium nitride film exposed within the trench;

wherein the first etching gas comprises boron trichloride and the second etching gas comprises chlorine, and wherein a ratio of the first flow rate to the second flow rate is greater than or equal to 1:1.

The present invention uses flow rate ratios of boron trichloride $(BCl_3)$ to chlorine $(Cl_2)$ ≥1:1 when etching additive-containing aluminium nitride films to permit steeper sidewall profiles to be generated. Additionally, flow rate ratios of $BCl_3$ to $Cl_2$ ≥1:1 can increase the additive-containing aluminium nitride film selectivity to bottom electrodes, reducing the underlayer loss when etching to one of these underlayer electrode films.

In an embodiment, the method further comprises introducing a third etching gas, such as argon, into the chamber. The third etching gas is introduced into the chamber with a third flow rate, a ratio of the first flow rate to the third flow rate being greater than 2:1.

In an embodiment, the method of plasma etching comprises a primary etching stage and a secondary etching stage. The secondary etching stage may take place immediately after the primary etching stage. The first flow rate of the first etching gas into the chamber is substantially the same during the primary and secondary etching stages, and the second flow rate of the second etching gas into the chamber is substantially the same during the primary and secondary etching stages.

In an embodiment, the first flow rate comprises substantially 60 sccm and the second flow rate comprises substantially 40 sccm. The third etching gas is introduced into the chamber with a third flow rate within the range 20-25 sccm.

In an embodiment, the gas pressure within the chamber during the primary etching stage comprises approximately 50% of the gas pressure during the secondary etching stage. The gas pressure within the chamber is maintained at substantially 2-4 mTorr during the primary etching stage and at substantially 5 mTorr during the secondary etching stage.

In an embodiment, the plasma is established within the chamber using an inductively coupled plasma generating device. The plasma generating device is electrically powered with approximately 50% of the electrical power during the secondary etching stage compared with the primary etching stage.

In an embodiment, the platen is electrically powered during the secondary etching stage with an electrical power which is less than 50% of the electrical power used during the primary etching stage. The secondary etching stage is used when etching a trench through the additive-containing aluminium nitride film toward a side of the substrate opposite the side upon which the additive-containing aluminium nitride film is deposited, and in an embodiment, the secondary etching stage is commenced before the trench extends out from the substrate.

In an embodiment, the workpiece comprises a metal film, such as molybdenum, disposed upon the side of the substrate opposite the side upon which the additive-containing aluminium nitride film is deposited.

In an embodiment, the mask comprises a photoresist mask.

DESCRIPTION OF THE DRAWINGS

The present invention will now be described by way of example only and with reference to the accompanying drawings in which:

FIG. 6(*a*) illustrates the side wall angle of a 5 μm trench with no $BCl_3$ present, and FIG. 6(*b*) illustrates with the use of $BCl_3$.

FIG. 7(*a*) illustrates the side wall angle in a 100 μm CD trench with no $BCl_3$, and FIG. 7(*b*) illustrates the side wall angle with the use of $BCl_3$. The 100 μm CD trenches have a shallower pre-etch profile than that of the 5 μm trenches.

DETAILED DESCRIPTION OF THE DISCLOSURE

Figure 1:
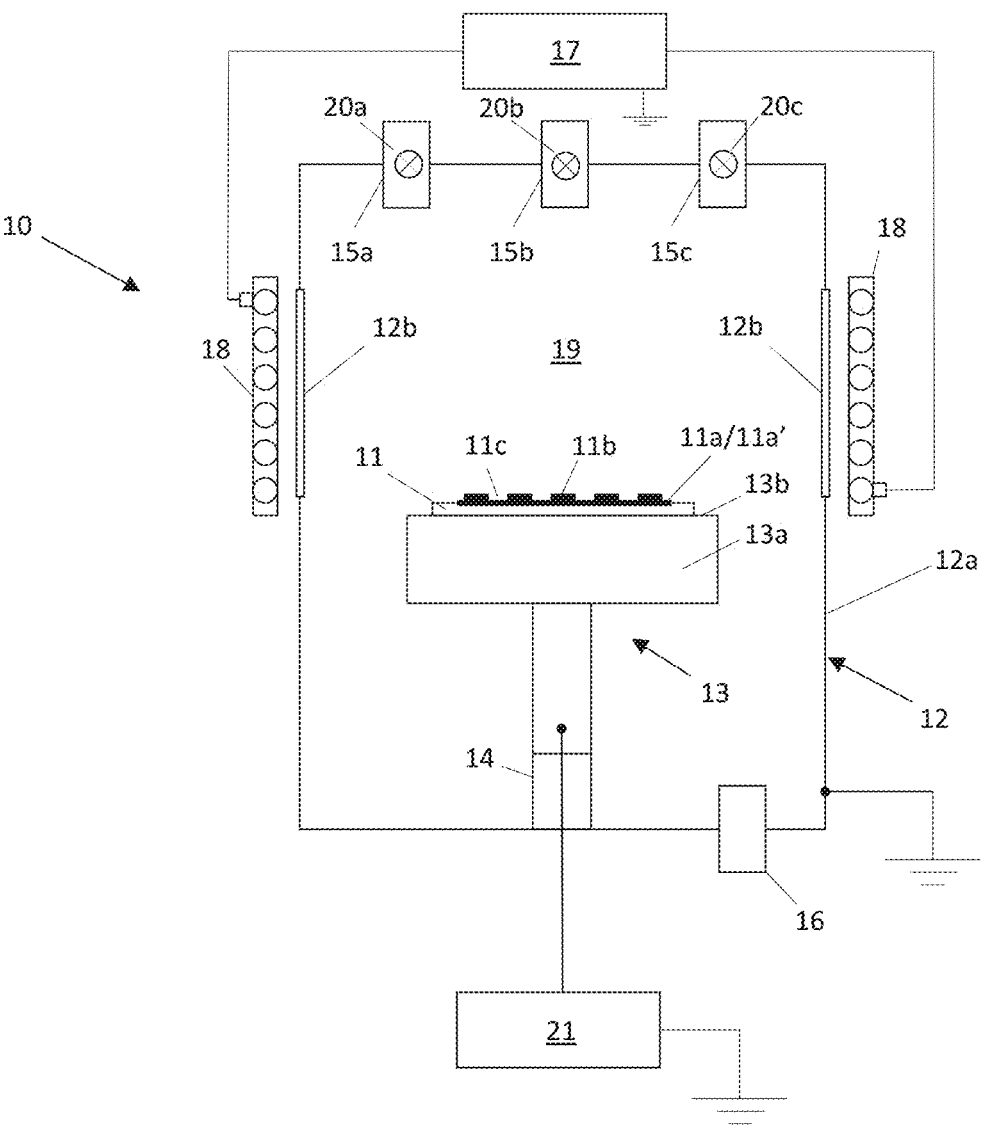
FIG. 1 is schematic illustration of a plasma etching apparatus for etching an additive-containing aluminium nitride film.

Referring to FIG. 1 of the drawings, there is provided a schematic illustration of an apparatus 10 for plasma etching a workpiece 11, and comprises a process chamber 12, within which the plasma etching of the workpiece 11 is performed.

The apparatus 10 further comprises a platen assembly 13, which may also be formed of a metal, such as aluminium, disposed within the chamber 12, but which is electrically isolated from the chamber walls 12*a* by conventional means, such as ceramic breaks 14. The platen assembly 13 comprises a body 13*a* having a support surface 13*b* for receiving the workpiece 11 and is electrically biased using a radio frequency (RF) voltage generator. The provision of a negative bias voltage to the platen assembly 13 for example, can help to control positively charged ion bombardment of the surface of the workpiece 11 from the plasma.

The process chamber 12 comprises chamber walls 12*a* which may be formed of a metal, such as aluminium for example, and which are typically electrically grounded. The chamber 12 further comprises a first, second and a third gas inlet 15*a*, 15*b*, 15*c* via which a source of a first, second and third etching gas (not shown) respectively, can fluidly couple for introducing the gases into the chamber 12. The chamber 12 further comprises an outlet 16, via which the gases and any by-products of the etching process can pass out from the chamber 12.

In an embodiment, the plasma is generated by applying an RF voltage from an RF voltage generator 17, to one or more antenna 18, which are disposed around the chamber 12 and located adjacent a respective dielectric window section 12*b* formed in the chamber walls 12*a*. The one or more antenna 18 may comprise a substantially planar spiral configuration, a helical coil configuration or a toroidal configuration, for example, and as with standard practice, impedance matching of the RF signal from the generator 17 with the antenna 18 is carried out to minimize reflection of electrical power from the antenna 18. The antennas 18 are placed around the chamber 12 and the electrical power is inductively coupled into the chamber 12, through the dielectric window sections 12*b*.

A plasma is generated in a region 19 of the chamber 12 which is disposed above the workpiece 11 so that the workpiece 11 becomes exposed to the plasma. The gases are introduced into the chamber 12 via a respective flow regulator 20*a*, 20*b*, 20*c* coupled with the respective inlet 15*a*, 15*b*, 15*c*, and the inlet 15*a*, 15*b*, 15*c* and outlet 16 of the chamber 12 are disposed on opposite sides of the plasma region 19 so that the etching gases are required to pass through the chamber 12, via the region 19 and over the workpiece 11, in passing to the outlet 16.

Figure 2:
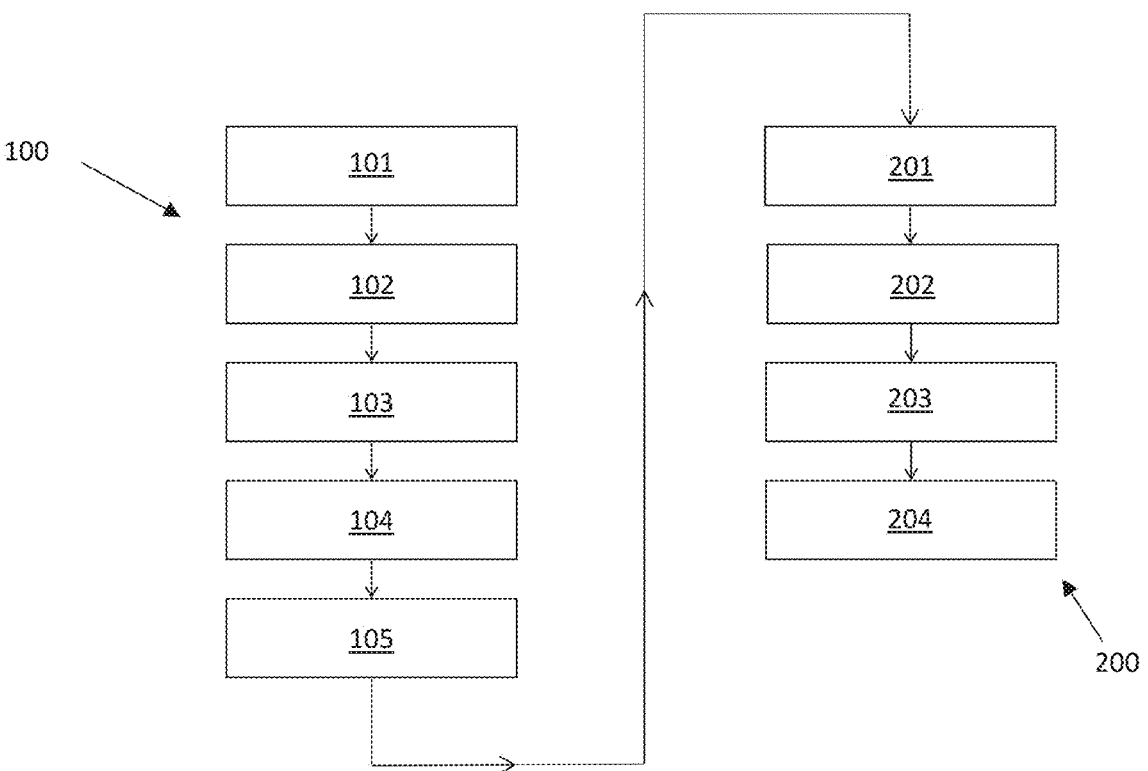
FIG. 2 is a flowchart outlining the steps associated with the method of plasma etching an additive-containing aluminium nitride film according to an embodiment of the present invention.

Referring to FIG. 2 of the drawings, there is illustrated a flow chart outlining the steps associated with a method 100 for plasma etching an additive-containing aluminium nitride film according to an embodiment of the present invention. The method will be demonstrated with reference to an AlScN film, but the skilled reader will recognize that the method is equally applicable to AlYN films and AlErN films.

The method comprises placing a workpiece 11 upon a platen 13 within the plasma chamber 12 at step 101. The workpiece 11 comprises a substrate 11*a*, such as a silicon wafer substrate, upon which is deposited a piezoelectric AlScN film 11*b* using a pulsed DC sputtering technique, for example. In an embodiment, the film comprises $Al_{0.7}Sc_{0.3}N$, namely a film comprising 70% component of aluminium and a 30% component for scandium. Film composition determination is typically achieved through the use of Energy Dispersive Analysis of X-rays (EDAX). The workpiece 11 further comprises a mask 11*b* patterned with 5 μm-100 μm trenches 11*c* formed upon the film 11*a* using 4-4.4 μm of photoresist, before reflow.

With the workpiece 11 positioned upon the platen 13 within the chamber 12, the first, second and third etching gases are introduced into the chamber 12 via the respective inlet 15*a*-*c* using the respective flow regulator 20*a*-*c* at step 102, and the pressure within the chamber 12 is maintained at approximately 2-5 mTorr or substantially 3 mTorr by a pressure regulator (not shown). Once the chamber 12 has been suitably conditioned with the etching gases, an RF potential is applied to the antenna 18 at step 103, via generator 17 to inductively couple electrical power into the etching gas, and thus initiate a plasma and commence the etching of the $Al_{0.7}Sc_{0.3}N$ film. A bias voltage is also applied to the platen assembly 13 at step 104, through the use of the voltage generator 21, typically operating at 13.56 MHz, to provide an etching of the AlScN film 11b at step 105.

The antenna 18 is powered with an electrical power of approximately 1000 W and the platen 13 is powered with an electrical power of approximately 1025 W. The first etching gas comprises boron trichloride ($BCl_3$) and the flow regulator 20a is arranged to deliver $BCl_3$ into the chamber 12 with a flow rate of substantially 60 sccm. The second etching gas comprises chlorine ($Cl_2$) and this $Cl_2$ gas is delivered into the chamber 12 at a rate of substantially 40 sccm, as determined by flow regulator 20b. The third etching gas comprises Argon (Ar) and this Ar gas is delivered into the chamber 12 at a rate of substantially 25 sccm, as determined by flow regulator 20c. In this respect, the ratio of the flow rate of the $BCl_3$ gas to the $Cl_2$ gas into the chamber 12 is approximately 3:2, namely greater than a ratio of 1:1, and the ratio of the flow rate of the $BCl_3$ gas to the Ar gas into the chamber 12 is approximately 3:1, namely greater than a ratio of 2:1.

Increasing the $BCl_3$:$Cl_2$ flow ratio is found to increase the peak-peak voltage between the platen 13 and the chamber 12, which is known to increase the etch rate of AlScN. To offset this increase and obtain a more accurate representation of the chemical and sputter components of $BCl_3$, the platen bias was adjusted using generator 21 to ensure that the peak-peak voltage was approximately matched across all data points. However, when the bias is adjusted to compensate for this effect, an increase in the AlScN etch rate is still observed, suggesting that the increased sputter component of $BCl_3$ is the cause.

Figure 3:
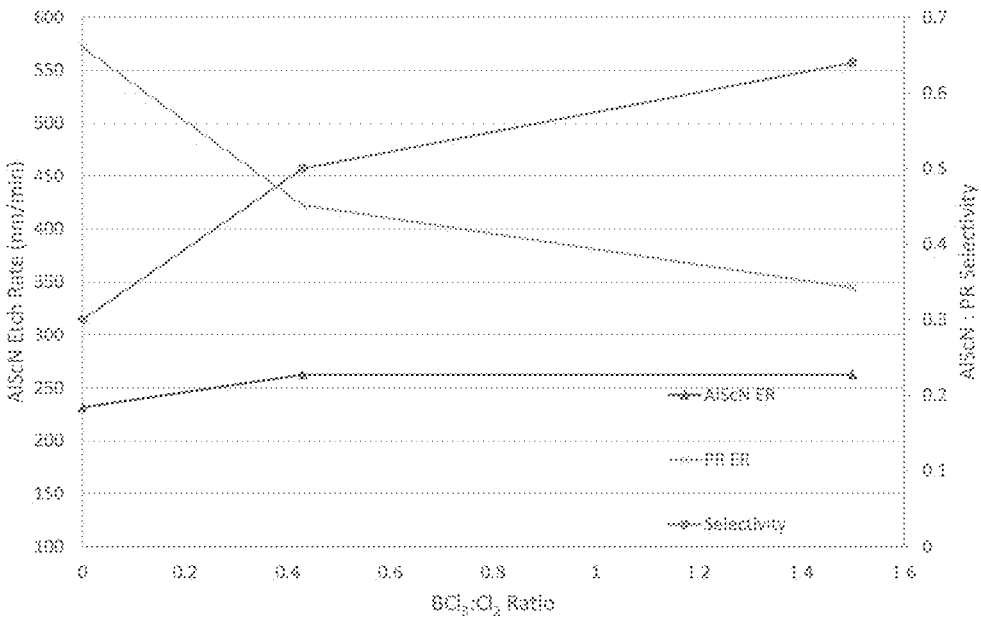
FIG. 3 is a graph illustrating the increase in AlScN to photoresist selectivity in 5 μm CD trenches as the flow rate ratio of $BCl_3$ to $Cl_2$ increases.

Adding $BCl_3$ during a $Cl_2$ based AlScN etch is believed to encourage the formation of boron-nitrogen based polymers. These polymers may condense on the mask 11b (photoresist, $SiO_2$, etc.), decreasing the mask etch rate (see FIG. 3), whilst the additional boron presence increases the sputter component of the etch, resulting in an increased AlScN etch rate. Additionally, $BCl_3$ is believed to fractionate less readily into reactive $Cl^-$ ions and neutrals compared to $Cl_2$, thereby reducing the chemical component of the etch as the $BCl_3$:$Cl_2$ ratio is increased. Typically, the etch rates of both AlScN film 11a and the photoresist decrease by a similar percentage as the flow of $Cl_2$ is decreased, resulting in an unchanging selectivity. However, as the Cl presence is reduced from the increased $BCl_3$:$Cl_2$ flow rate ratio, the drop in AlScN etch rate is offset by the increased sputter component of $BCl_3$, resulting in an increased selectivity to the mask 11b.

The compounded effect of a B—N-based polymer with the different fractionation properties of $BCl_3$ gives rise to an increased AlScN selectivity to the mask 11b. The decreased photoresist etch rate and increased sputter component would also be applicable to lower and higher scandium percentages than the $Al_{0.7}Sc_{0.3}N$ data shown, meaning that a steeper side wall trench profile and increased selectivity could be obtained at a range of scandium percentages. Similar results would be expected for $Al_{1-x}Y_xN$ and $Al_{1-x}Er_xN$ films. The boiling points of erbium chloride and yttrium chloride are approximately 1500° C. while scandium chloride is approximately 960° C. The etch front will contain residues which will require sputter/physical removal. It would therefore be expected that $Al_{1-x}Y_xN$ and $Al_{1-x}Er_xN$ films would also require similar physical/chemical process conditions to achieve similar results to the AlScN which also have very high temperature Cl compounds.

Figure 4:
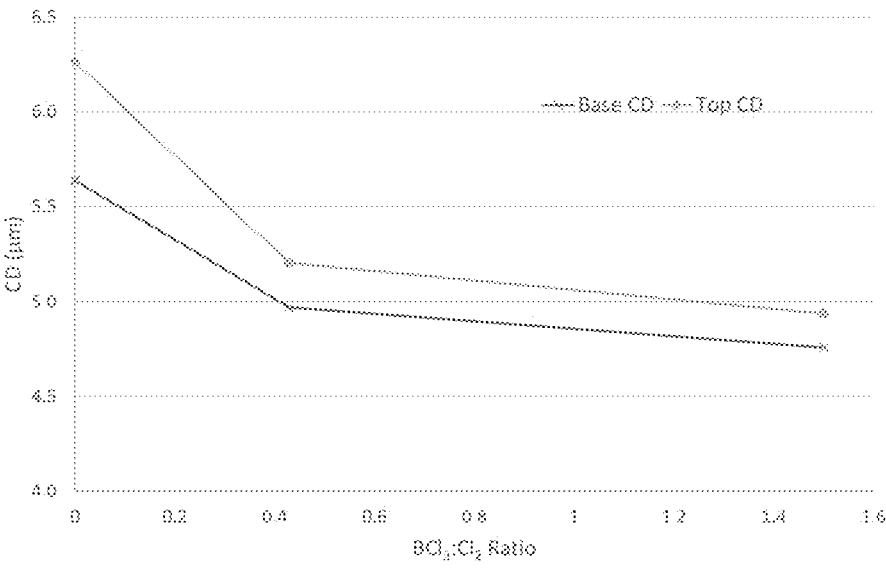
FIG. 4 is a graph illustrating the decrease in the top and bottom CD of 5 μm trenches as the flow rate ratio of $BCl_3$ to $Cl_2$ increases.
Figure 5:
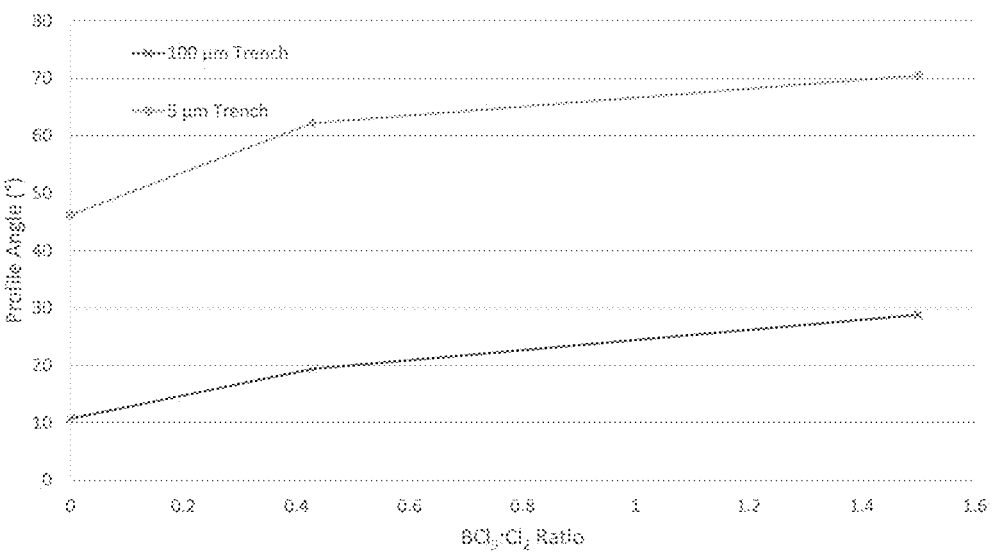
FIG. 5 is a graph illustrating the increase in sidewall angle in 5 μm and 100 μm CD trenches as the flow rate ratio of $BCl_3$ to $Cl_2$ increases.
Figure 6:
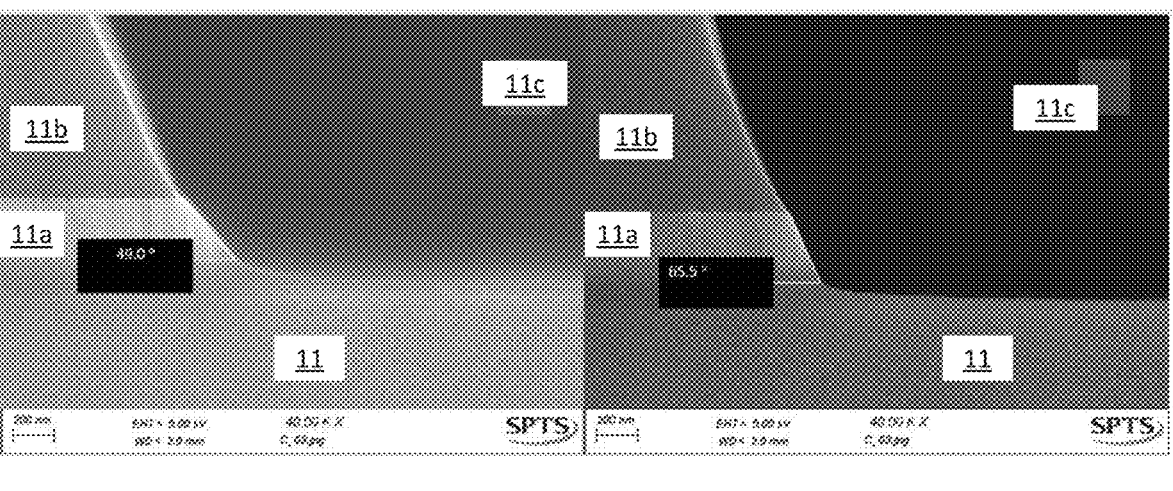
FIG. 6 is a scanning electron microscope image of a reflowed photoresist on a 500 nm thick $Al_{0.7}Sc_{0.3}N$ films on a silicon substrate.
Figure 7:
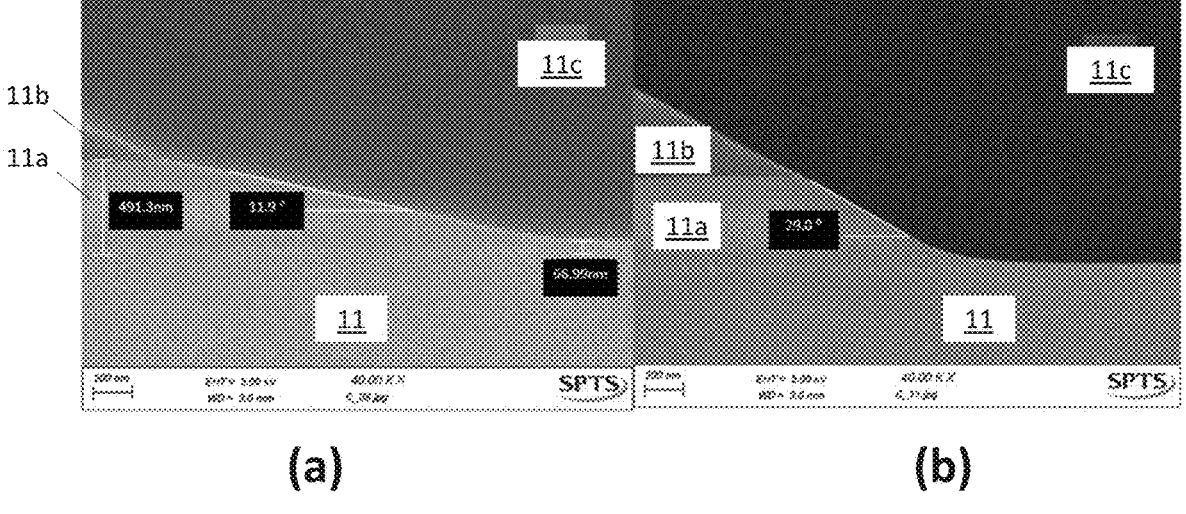
FIG. 7 is a scanning electron microscope image of a reflowed photoresist mask on 500 nm thick $Al_{0.7}Sc_{0.3}N$ film on a Si substrate.

Upon referring to FIG. 4 of the drawings, the increased selectivity to the 5 μm CD mask 11b is shown to decrease the lateral etch rate of the mask, thereby reducing the loss in the critical dimension (CD). The reduced CD loss thereby permits steeper sidewall profiles as shown in FIG. 5, and FIGS. 6(a), 6(b), 7(a) and 7(b). The 100 μm CD trenches have a shallower pre-etch mask profile than that of the 5 μm trenches, demonstrating that an increased $BCl_3$ flow rate compared with the $Cl_2$ flow rate, can impact a range of profiles and the CD of features.

A common method of controlling the selectivity to underlayers of the workpiece 11 is through the use of a 'soft-landing' step which typically utilizes a lower platen bias to decrease the underlayer etch rate and the subsequent loss. $BCl_3$ has been reported above to increase the efficiency of AlScN etching, but as a result of the added sputter component of the boron, it is counter-intuitive to assume that its use would also decrease the etch rate of underlayers and increase the selectivity to these films.

Accordingly in a further embodiment, a similar workpiece was formed using a Si wafer substrate, but in this embodiment, the $Al_{0.7}Sc_{0.3}N$ piezoelectric film 11a was replaced with a sputtered Mo film 11a' comprising an identical mask 11b to demonstrate the effect of the $BCl_3$:$Cl_2$ flow rate ratio on the etch rate of the Mo film 11a'. The substrate with Mo film 11a' was then placed in the process chamber and the Mo film was etched; the process conditions for the Mo etch are shown below alongside the process conditions for the piezoelectric film etch, for comparison:

TABLE 1

| Parameter | Main Etch (Piezoelectric film) | Soft Landing (Mo film etch) |
|---|---|---|
| Pressure (mTorr) | 3 | 5 |
| Source power (W) | 1000 | 500 |
| Platen power (W) | 1025 | 450 |
| $BCl_3$ flow rate (sccm) | 60 | 60 |
| $Cl_2$ flow rate (sccm) | 40 | 40 |
| Ar flow rate (sccm) | 25 | 20 |

From the above table it is evident that the plasma generating device 17 is powered with approximately twice the electrical power during the primary (main) etch compared with the secondary (soft landing) etch. Similarly, the platen 13 is powered with approximately 50% of the electrical power during the secondary etch compared with the primary etch. However, the pressure within the chamber during the secondary etch is almost double that compared with the primary etch.

Figure 8:
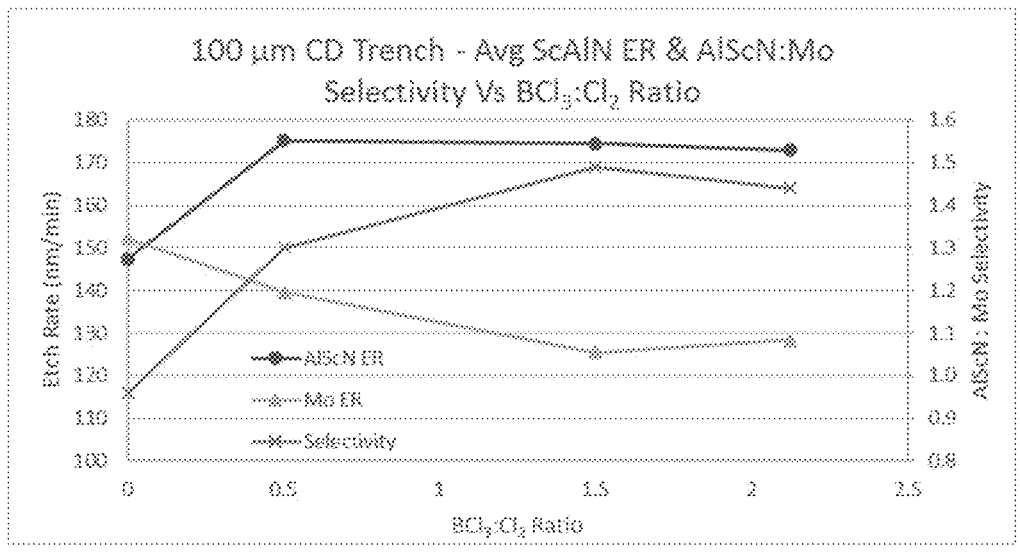
FIG. 8 is a graph illustrating the increase in $Al_{0.7}Sc_{0.3}N$ to Mo (bottom electrode) selectivity as the flow ratio of $BCl_3$ to $Cl_2$ ratio is increased. The Mo etch rate is calculated on photoresist patterned blanket Mo on Si wafers.

$BCl_3$:$Cl_2$ flow rate ratios ≥1:1 were found to be optimal for decreasing the etch rate of the Mo film 11a' and similarly increasing the AlScN selectivity to the Mo film 11a'. For electrodes, namely underlayers formed on the side of the substrate 11 opposite the piezoelectric film 11a, which etch readily in a chlorine-based chemistry, such as Mo, decreasing the $Cl_2$ presence decreases the underlayer etch rate. Much like for the AlScN:PR selectivity, as the $Cl_2$ flow rate is decreased, so too does the AlScN etch rate, resulting in minimal changes to the underlayer selectivity. However, the AlScN:Mo selectivity can be increased by the same mechanism as previously described for photoresist. The increased $BCl_3$:$Cl_2$ flow rate ratio reduces the $Cl_2$ presence, decreasing the Mo etch rate whilst the increased sputter component increases the AlScN etch rate, leading to an increased selectivity to the electrode. Ultimately this reduces the loss of the electrode when etching AlScN down to this metal film, as demonstrated in FIG. 8. The platen power was decreased in the 1.5 and 2.125 $BCl_3$:$Cl_2$ flow rate ratio tests (right two data points) to minimise the impact of increasing peak-peak voltage on the results.

The process of etching a workpiece 11 comprising an AlScN film 11*a* on one side and a Mo film 11*a'* on the underside, therefore comprises a primary etching stage 100 for etching a trench through the AlScN film 11*a* and the majority of the Si substrate 11, and a secondary etching stage 200 which takes place immediately after the primary etching stage 100, and which is commenced prior to the trench extending out from the Si substrate. The secondary etching stage 200 comprises increasing the pressure in the chamber 12 at step 201, reducing the electrical power supplied to the antenna at step 202 and reducing the electrical bias to the platen at step 203. Once the specific process conditions for the secondary etching stage (as shown in table 1) are achieved, the Mo film 11*a'* is then etched at step 204 to effectively extend the trench through the workpiece 11.

As a consequence of the $BCl_3$:$Cl_2$ flow rate ratio being ≥1:1 it has been demonstrated above that a high AlScN (and AlYN and AlErN) etch rate (>170 nm/min for 100 μm trenches and >250 nm/min for 5 μm trenches) with improved selectivity to the photoresist and lower electrode metal can be achieved. The ≥1:1 flow rate ratio would be applicable to all Al:Sc ratios, but due to the decreasing etch rate and increasing difficulty of etching AlN with higher percentages of doped scandium, the method becomes increasingly beneficial.

The invention claimed is:

1. A method of plasma etching an additive-containing aluminium nitride film, the process comprising:

placing a workpiece upon a platen within a plasma chamber, the workpiece comprising a substrate having an additive-containing aluminium nitride film deposited thereon and a mask disposed directly upon the additive-containing aluminium nitride film which defines at least one trench, the additive-containing aluminium nitride film containing an additive element selected from scandium (Sc), yttrium (Y) or erbium (Er), wherein the workpiece comprises a metal film disposed upon the substrate under the additive-containing aluminium nitride film, and wherein the metal film comprises molybdenum;

introducing a first etching gas into the chamber with a first flow rate;

introducing a second etching gas into the chamber with a second flow rate; and establishing a plasma within the chamber to etch the additive-containing aluminium nitride film exposed within the trench;

wherein the first etching gas comprises boron trichloride and the second etching gas comprises chlorine, and wherein a ratio of the first flow rate to the second flow rate is greater than or equal to 1:1; and wherein the plasma etching includes a primary etching stage and a secondary etching stage, wherein the secondary etching stage is used when etching a trench through the additive-containing aluminium nitride film toward a side of the substrate opposite a side upon which the additive-containing aluminium nitride film is deposited.

2. The method of plasma etching according to claim 1, further comprising introducing a third etching gas into the chamber.

3. The method of plasma etching according to claim 2, wherein the third etching gas comprises argon.

4. The method of plasma etching according to claim 2, wherein the third etching gas is introduced into the chamber with a third flow rate, and wherein a ratio of the first flow rate to the third flow rate is greater than 2:1.

5. The method of plasma etching according to claim 2, wherein the third etching gas is introduced into the chamber with a third flow rate within the range 20-25 sccm.

6. The method of plasma etching according to claim 1, wherein the secondary etching stage takes place immediately after the primary etching stage.

7. The method of plasma etching according to claim 1, wherein the flow rate of the first etching gas into the chamber is substantially the same during the primary and secondary etching stages.

8. The method of plasma etching according to claim 1, wherein the flow rate of the second etching gas into the chamber is substantially the same during the primary and secondary etching stages.

9. The method of plasma etching according to claim 1, wherein a gas pressure within the chamber during the primary etching stage is approximately 50% of the gas pressure during the secondary etching stage.

10. The method of plasma etching according to claim 1, wherein the gas pressure is maintained at substantially 2-4 mTorr during the primary etching stage.

11. The method of plasma etching according to claim 10, wherein the gas pressure within the chamber during the secondary etching stage is maintained at substantially 5 mTorr.

12. The method of plasma etching according to claim 1, wherein the plasma generating device is electrically powered with approximately 50% of the electrical power during the secondary etching stage compared with the primary etching stage.

13. The method of plasma etching according to claim 1, wherein the platen is electrically powered during the secondary etching stage with an electrical power which is less than 50% of the electrical power used during the primary etching stage.

14. The method of plasma etching according to claim 1, wherein the first flow rate of the first etching gas into the chamber comprises substantially 60 sccm and the second flow rate of the second etching gas into the chamber comprises substantially 40 sccm.

15. The method of plasma etching according to claim 1, wherein the secondary etching stage is commenced before the trench extends out from the substrate.

16. The method of plasma etching according to claim 1, wherein the plasma is established within the chamber using an inductively coupled plasma generating device.

17. The method of plasma etching according to claim 1, wherein the mask comprises a photoresist.

\* \* \* \* \*